US010326378B2

(12) United States Patent
Doo et al.

(10) Patent No.: US 10,326,378 B2
(45) Date of Patent: Jun. 18, 2019

(54) INVERTER ASSEMBLY

(71) Applicant: Faraday & Future Inc., Gardena, CA (US)

(72) Inventors: Young Mok Doo, La Palma, CA (US); Steven E. Schulz, Torrance, CA (US); Silva Hiti, Redondo Beach, CA (US)

(73) Assignee: FARADAY & FUTURE INC., Gardena, CA (US)

( * ) Notice: Subject to any disclaimer, the term of this patent is extended or adjusted under 35 U.S.C. 154(b) by 0 days.

(21) Appl. No.: 14/952,829

(22) Filed: Nov. 25, 2015

(65) Prior Publication Data

US 2017/0064864 A1 Mar. 2, 2017

Related U.S. Application Data

(63) Continuation of application No. 14/841,520, filed on Aug. 31, 2015, now Pat. No. 9,241,428.

(51) Int. Cl.
*H02M 7/00* (2006.01)
*H05K 7/14* (2006.01)
(Continued)

(52) U.S. Cl.
CPC .......... *H02M 7/003* (2013.01); *H05K 7/1432* (2013.01); *H05K 7/20927* (2013.01);
(Continued)

(58) Field of Classification Search
CPC ............. H05K 7/2089; H05K 7/20927; H05K 7/20218–20272; H05K 7/1432; H01H 9/52; H01L 23/473; H02M 7/003
See application file for complete search history.

(56) References Cited

U.S. PATENT DOCUMENTS 5,879,833 A 3/1999 Yoshii et al.
6,493,249 B2 12/2002 Shirakawa et al.
(Continued)

FOREIGN PATENT DOCUMENTS

EP 1206029 A2 5/2002
EP 1919069 A2 5/2008
(Continued)

OTHER PUBLICATIONS

International Search Report for International Application No. PCT/US2017/016598 dated May 31, 2017.
(Continued)

*Primary Examiner* — Zachary Pape
(74) *Attorney, Agent, or Firm* — Knobbe Martens Olson & Bear LLP

(57) ABSTRACT

Power inverter assemblies are provided herein for use with motor vehicles. An inverter assembly may have a symmetrical structure configured to convert DC input power to AC output power. The inverter assembly may include a housing enclosing a symmetrical DC input portion, a symmetrical AC output portion, a DC link capacitor, and a gate drive portion having a pair of power modules. The symmetrical DC input portion can include a DC input bus bar sub-assembly to which the DC link capacitor is coupled, and a second DC bus bar sub-assembly that may electrically couple the DC link capacitor with the power modules. The symmetrical AC output portion may include a three phase output AC bus bar sub-assembly to which the power modules can be electrically coupled. A cooling sub-assembly may be provided for cooling the power modules with fluid transfer using a coolant.

17 Claims, 18 Drawing Sheets

(51) Int. Cl.
  *H05K 7/20* (2006.01)
  *H01H 9/52* (2006.01)
  *H01R 25/16* (2006.01)
  *H01L 23/473* (2006.01)

(52) U.S. Cl.
  CPC .............. *H01H 9/52* (2013.01); *H01L 23/473* (2013.01); *H01R 25/162* (2013.01); *H05K 7/209* (2013.01); *H05K 7/2089* (2013.01)

(56) References Cited

U.S. PATENT DOCUMENTS

| | | | |
|---|---|---|---|
| 6,525,950 B1 | 2/2003 | Shirakawa et al. | |
| 6,618,278 B2 | 9/2003 | Suzuki et al. | |
| 6,621,701 B2 | 9/2003 | Tamba et al. | |
| 6,943,445 B2 | 9/2005 | Shirakawa et al. | |
| 7,016,192 B2 | 3/2006 | Beihoff et al. | |
| 7,542,318 B2 | 6/2009 | Otsuka et al. | |
| 7,710,721 B2 | 5/2010 | Matsuo et al. | |
| 7,722,372 B2 * | 5/2010 | Matsumoto | H01R 13/42 |
| | | | 174/68.2 |
| 7,830,689 B2 | 11/2010 | Nakamura et al. | |
| 7,855,887 B2 | 12/2010 | Kakuda et al. | |
| 7,965,510 B2 | 6/2011 | Suzuki et al. | |
| 8,057,928 B2 | 11/2011 | Kohn et al. | |
| 8,072,758 B2 | 12/2011 | Groppo et al. | |
| 8,159,849 B2 | 4/2012 | Nakajima et al. | |
| 8,193,449 B2 * | 6/2012 | Esmaili | H05K 7/1432 |
| | | | 174/70 B |
| 8,587,977 B2 | 11/2013 | Nishikimi et al. | |
| 8,614,906 B2 | 12/2013 | Nakajima et al. | |
| 8,699,254 B2 | 4/2014 | Nishikimi et al. | |
| 8,780,557 B2 | 7/2014 | Duppong et al. | |
| 8,848,370 B2 | 9/2014 | Shin et al. | |
| 8,953,335 B2 | 2/2015 | Abe et al. | |
| 9,042,101 B2 | 5/2015 | Tokuyama et al. | |
| 9,042,147 B2 | 5/2015 | Ishii et al. | |
| 9,048,721 B2 | 6/2015 | Abe et al. | |
| 9,362,040 B2 | 6/2016 | Rai et al. | |
| 9,472,488 B2 * | 10/2016 | Gohara | H01L 23/473 |
| 2001/0046624 A1 | 11/2001 | Goto et al. | |
| 2002/0034087 A1 | 3/2002 | Suzuki et al. | |
| 2003/0067748 A1 | 4/2003 | Tamba et al. | |
| 2006/0052914 A1 | 3/2006 | Kubokawa et al. | |
| 2006/0274561 A1 | 12/2006 | Ahmed et al. | |
| 2007/0002594 A1 | 1/2007 | Otsuka et al. | |
| 2008/0138698 A1 | 6/2008 | Ogami et al. | |
| 2008/0251909 A1 | 10/2008 | Tokuyama et al. | |
| 2009/0023059 A1 | 1/2009 | Kinoshita et al. | |
| 2009/0023306 A1 | 1/2009 | Korich et al. | |
| 2009/0294195 A1 | 12/2009 | Otsuka et al. | |
| 2010/0047682 A1 | 2/2010 | Houchin-Miller et al. | |
| 2011/0205724 A1 | 8/2011 | Nakajima et al. | |
| 2011/0261600 A1 * | 10/2011 | Tachibana | H02M 7/003 |
| | | | 363/131 |
| 2012/0006595 A1 | 1/2012 | Tachibana | |
| 2013/0039009 A1 | 2/2013 | Shin et al. | |
| 2013/0106255 A1 | 5/2013 | Tamura et al. | |
| 2013/0265808 A1 | 10/2013 | Ishii et al. | |
| 2013/0314963 A1 | 11/2013 | Tokuyama et al. | |
| 2014/0119087 A1 * | 5/2014 | Matsuoka | H02M 7/003 |
| | | | 363/132 |
| 2014/0140118 A1 | 5/2014 | Ishikawa et al. | |
| 2014/0184212 A1 | 7/2014 | Yamaguchi et al. | |
| 2014/0197532 A1 | 7/2014 | Ide et al. | |
| 2015/0029666 A1 | 1/2015 | Kosuga et al. | |
| 2015/0131232 A1 | 5/2015 | Ishino et al. | |
| 2015/0173238 A1 * | 6/2015 | Nakanishi | H02M 7/003 |
| | | | 361/709 |
| 2015/0334875 A1 * | 11/2015 | Topolewski | H05K 7/20254 |
| | | | 361/699 |

FOREIGN PATENT DOCUMENTS

| | | |
|---|---|---|
| JP | 2001326318 A | 11/2001 |
| JP | 2004312925 A | 11/2004 |

OTHER PUBLICATIONS

International Search Report for International Application No. PCT/US2015/063261 dated May 30, 2016.

Non-Final Office Action, dated Dec. 31, 2015, U.S. Appl. No. 14/841,617, filed Aug. 31, 2015.

* cited by examiner

INVERTER ASSEMBLY

CROSS-REFERENCE TO RELATED APPLICATIONS

This application is a continuation of U.S. patent application Ser. No. 14/841,520, filed Aug. 31, 2015. This application is related to U.S. patent application Ser. No. 14/841,526, filed Aug. 31, 2015, and U.S. patent application Ser. No. 14/841,532, filed Aug. 31, 2015. The subject matter of the aforementioned applications is incorporated herein by reference for all purposes.

FIELD OF THE PRESENT DISCLOSURE

The present disclosure relates generally to an inverter assembly and, more specifically, but not by limitation, to an inverter assembly comprising structures configured to convert a DC input to a three phase AC output.

SUMMARY OF THE PRESENT DISCLOSURE

According to various embodiments, the present disclosure may be directed to an inverter assembly, comprising: (a) a housing that encloses: (i) a DC input bus bar sub-assembly; (ii) a three phase output AC bus bar sub-assembly; (iii) a DC link capacitor electrically coupled to the DC input bus bar sub-assembly; (iv) a second DC bus bar sub-assembly that electrically couples the DC link capacitor with a plurality of power modules, wherein the plurality of power modules can be electrically coupled to the three phase output AC bus bar sub-assembly; and (v) a cooling sub-assembly associated with the plurality of power modules.

According to some embodiments, the present disclosure may be directed to an inverter assembly, comprising: (a) a housing that encloses: (i) a DC input bus bar sub-assembly; (ii) a three phase output AC bus bar sub-assembly having symmetrically aligned output tabs that each carry a unique phase of an AC power signal; (iii) a DC link capacitor electrically coupled to the DC input bus bar sub-assembly; (iv) a gate drive circuit board; (v) a plurality of power modules mounted to the gate drive circuit board, the plurality of power modules producing the AC power signal; and (vi) a second DC bus bar sub-assembly that electrically couples the DC link capacitor with the plurality of power modules, wherein the plurality of power modules can be electrically coupled to the three phase output AC bus bar sub-assembly.

According to some embodiments, the present disclosure may be directed to an inverter assembly, comprising: (a) a housing that can comprise a cover and a lower enclosure, wherein the lower enclosure receives: (i) a DC input bus bar sub-assembly mounted to a sidewall of the lower enclosure of the housing; (ii) a DC link capacitor electrically coupled to the DC input bus bar sub-assembly with a pair of connectors that extend upwardly to the DC input bus bar sub-assembly, the DC link capacitor being potted into a void in the housing; (iii) a gate drive circuit board; (iv) a plurality of power modules mounted an underside of the gate drive circuit board, the plurality of power modules producing an AC power signal from DC power received from the DC link capacitor; (v) a second DC bus bar sub-assembly that electrically couples the DC link capacitor with the plurality of power modules, wherein the second DC bus bar sub-assembly bridges above the gate drive circuit board and the DC link capacitor; and (vi) a three phase output AC bus bar sub-assembly comprising three bus bars which can be physically separated from one another, the three bus bars comprising linearly aligned power module tabs that electrically couple with linearly aligned output terminals of the plurality of power modules, wherein the three bus bars further comprise output tabs that each carry a unique phase of the AC power signal.

BRIEF DESCRIPTION OF THE DRAWINGS

Certain embodiments of the present disclosure are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

DESCRIPTION OF EXEMPLARY EMBODIMENTS

Figure 1:
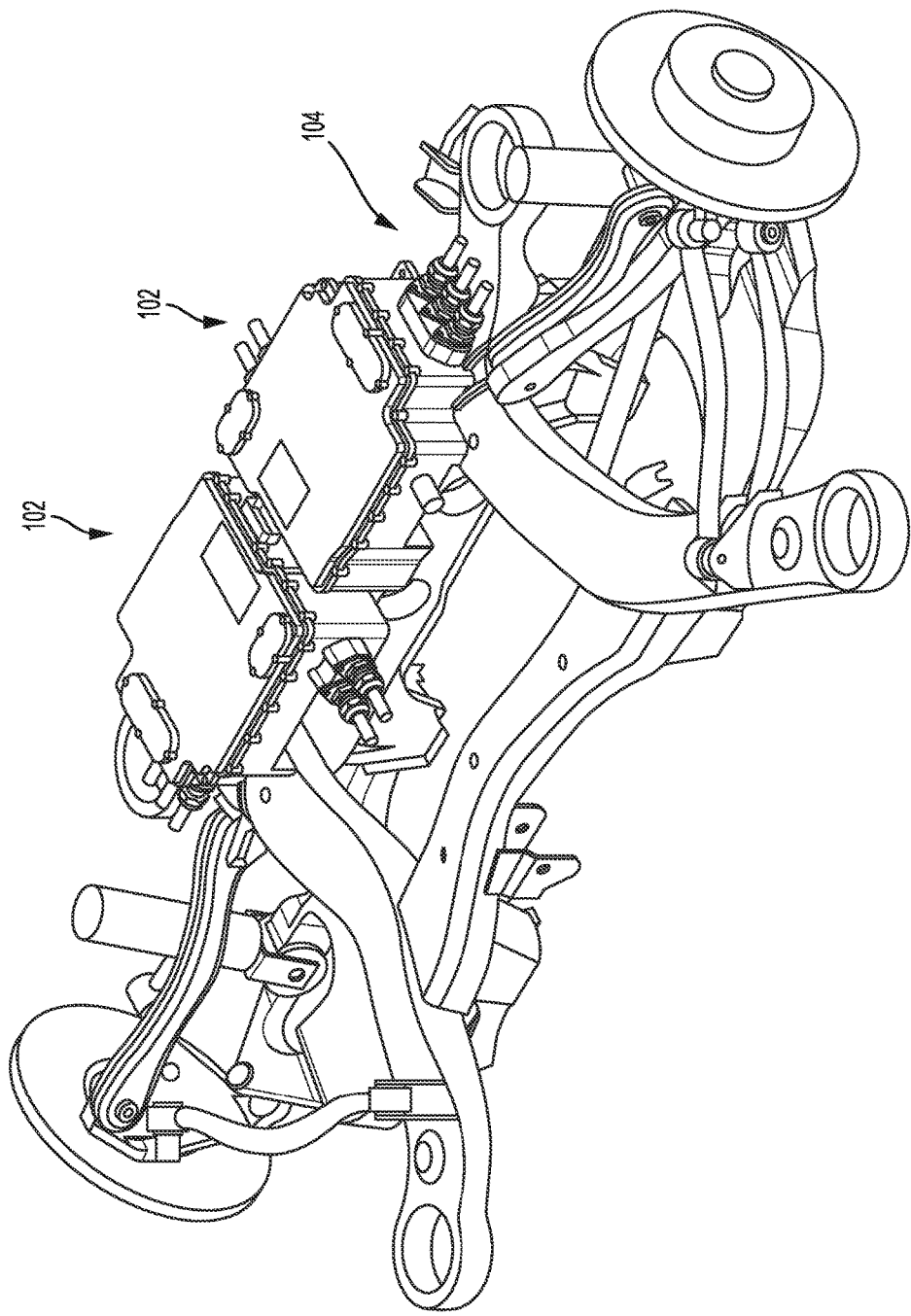
FIG. 1 is a perspective view of an exemplary drive train that can comprise inverter assemblies of the present disclosure.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that like or analogous elements and/or components, referred to herein, may be identified throughout the drawings with like reference characters. It will be further understood that several of the figures are merely schematic representations of the present disclosure. As such, some of the components may have been distorted from their actual scale for pictorial clarity.

In general, the present disclosure is directed to inverter assemblies and their methods of manufacture and use. An example inverter assembly can comprise a symmetrical structure configured to convert DC input power to AC output power.

Some embodiments can include a symmetrical DC input section, a symmetrical AC output section, a gate drive circuit board, and a controller. The gate drive circuit board and controller can be associated with two inverter power modules coupled in parallel. The power modules can provide currents significantly exceeding 400 amps RMS (root mean squared) and in various embodiments, each can comprise an IGBT (insulated gate bipolar transistor), or other suitable element, for switching the direct current into an alternating current. The total RMS current may exceed that which may be typically available by a single commercially available power module. The DC input section can include a DC input bus and a DC bus sub-assembly. The DC bus sub-assembly can have a symmetrical structure with a layered design, including a positive plate and a negative plate substantially overlapping each other. The positive plate can be coupled to the positive terminal of the DC input bus through a plurality of positive input tabs. The negative plate can be coupled to the negative terminal of the DC input bus through a plurality of negative input tabs. The positive plate can have two or more positive output tabs and two or more negative output tabs coupled to the input terminals of the two inverter power modules.

The AC output section can include a plurality of output bus bars, each having a symmetrical structure. In an embodiment, the AC output section can provide a three-phase AC power signal. Each of the output bus bars can correspond to a channel (phase) of the three-phase AC power signal. Each bus bar can include two input tabs coupled to output terminals of each channel of the two inverter power modules and an output tab coupled to an AC output terminal of the inverter. The output tab may be disposed at substantial equal distances from the two input tabs of each AC bus bar. These and other advantages of the present disclosure will be described in greater detail infra with reference to the collective drawings.

Referring now to FIG. 1, which illustrates the positioning of two inverter assemblies, such as exemplary inverter assembly 102. The inverter assemblies can be disposed on an exemplary drive train 104.

Figure 2:
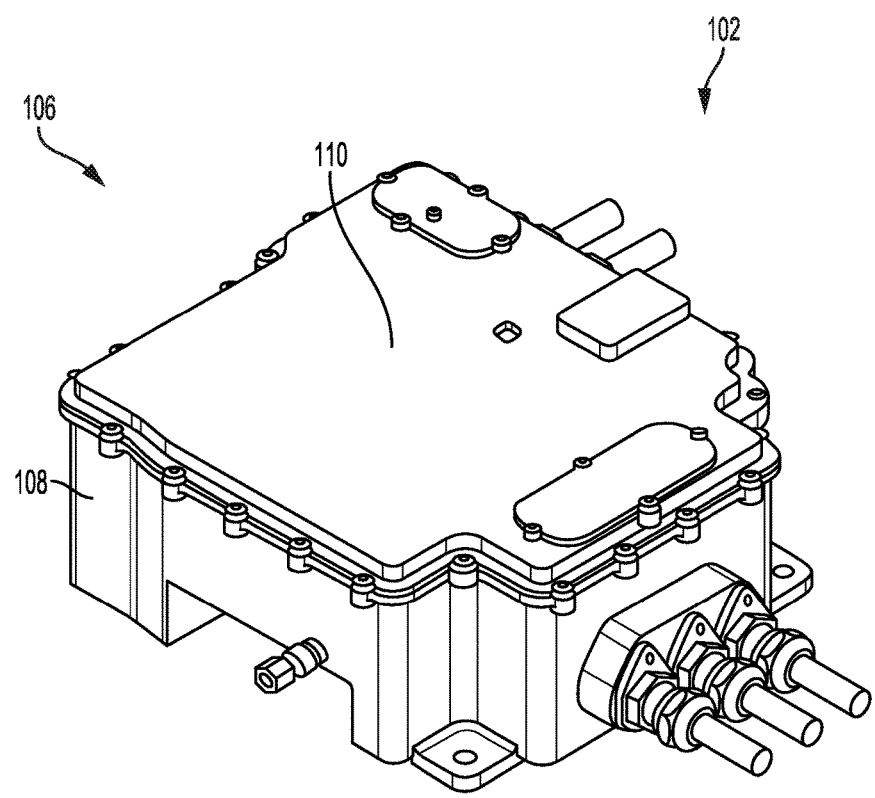
FIG. 2 is a perspective view of an exemplary inverter assembly.
Figure 3:
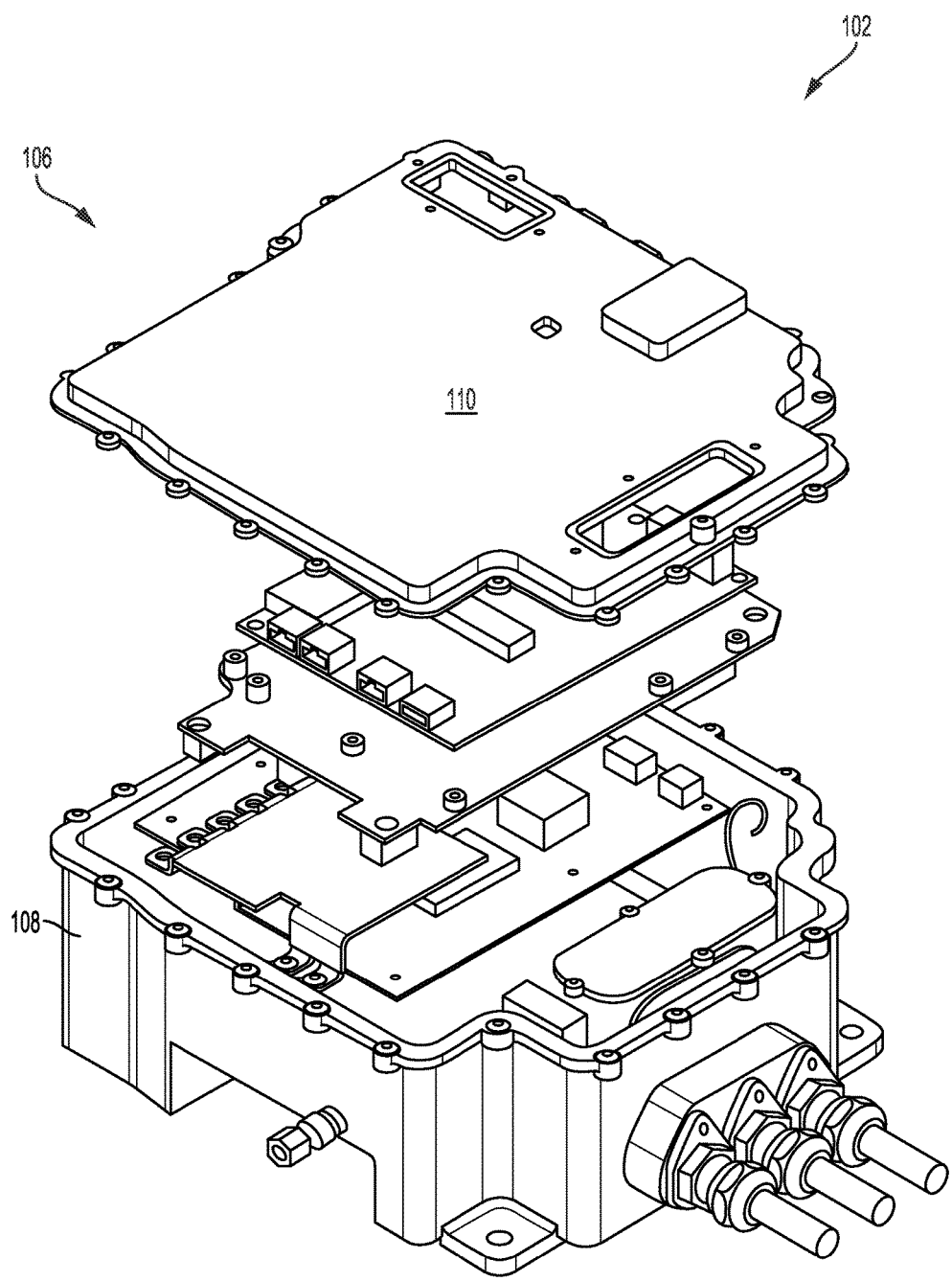
FIG. 3 is an exploded perspective view of the exemplary inverter assembly of FIG. 2.

FIGS. 2 and 3 collectively illustrate the exemplary inverter assembly 102 which can comprise a housing 106 that can comprise a lower enclosure 108 and a cover 110.

Figure 4:
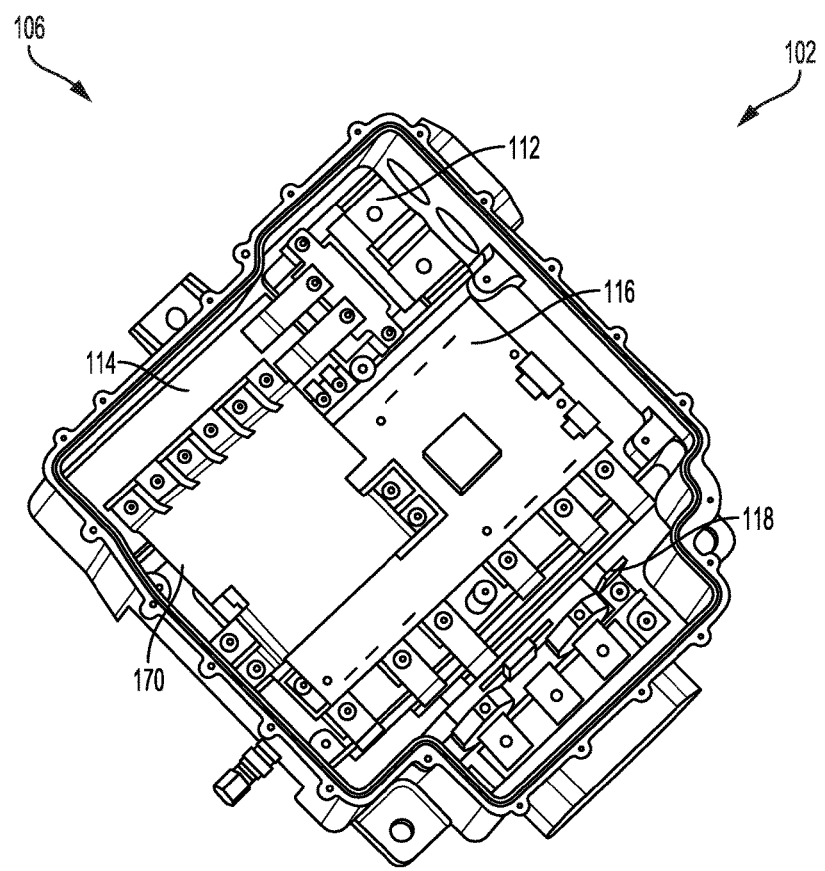
FIG. 4 is a top down view of the exemplary inverter assembly with a top cover removed.

FIG. 4 is a top down view of the exemplary inverter assembly 102 with the cover 110 removed to expose internal components of the inverter assembly 102. In some embodiments, the inverter assembly 102 can comprise a DC bus sub-assembly (referred to herein as "DC bus bar 112"), a DC link capacitor 114 (which may comprise a capacitor bank and also be referred to as DC link capacitor bank 114), a DC input bus bar sub-assembly 170, a gate drive circuit board 116, and a three phase output AC bus bar sub-assembly 118.

Figure 5A:
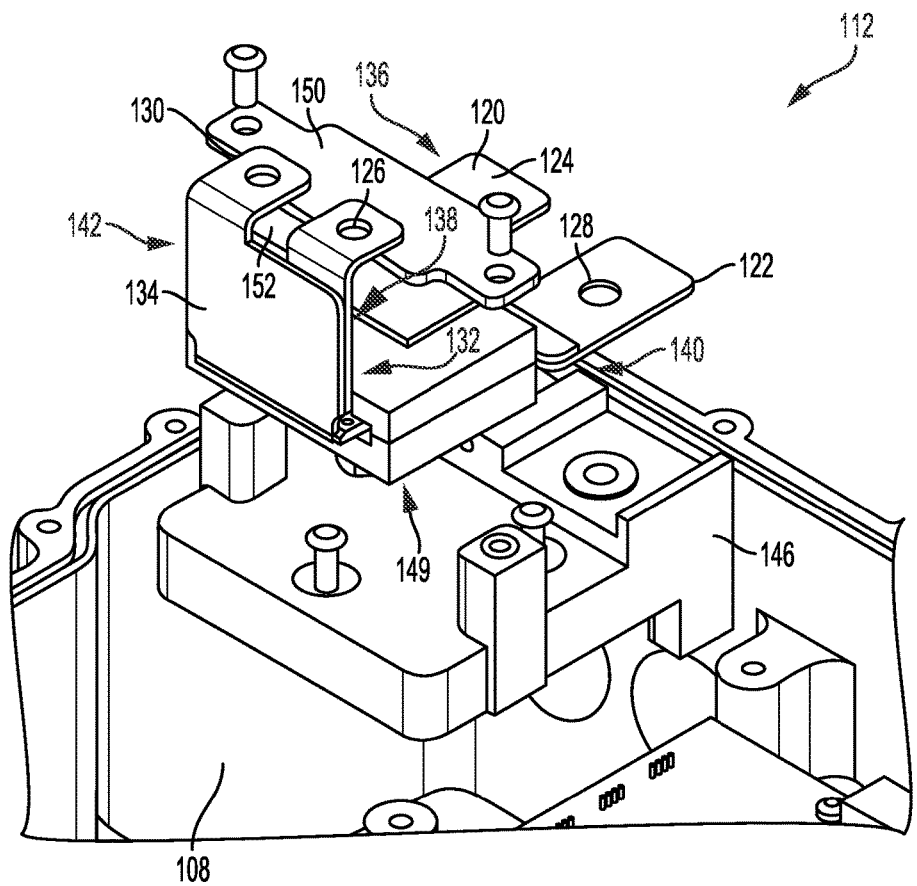
FIGS. 5A, 5B, and 5C are various views of an exemplary DC bus bar sub-assembly.
Figure 5B:
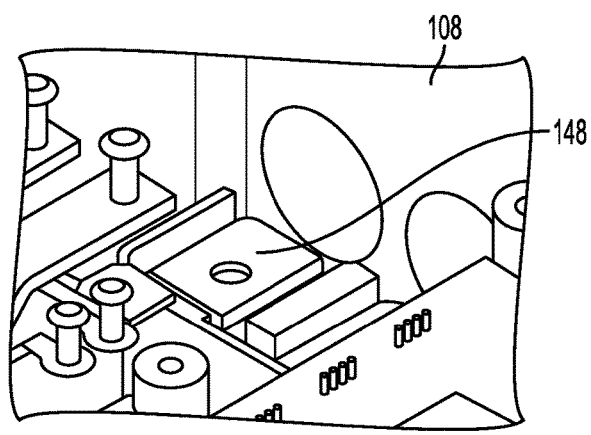
Figure 5C:
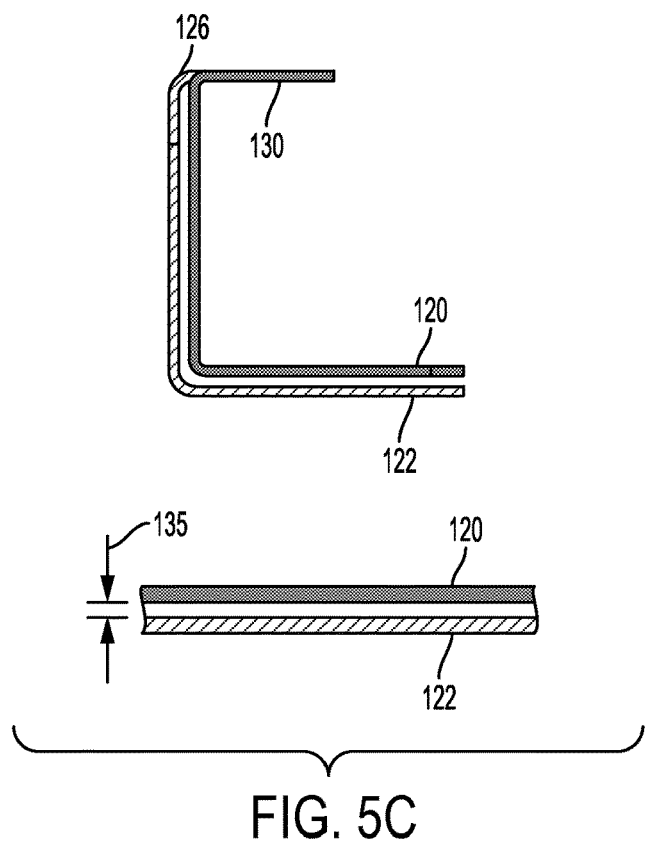

FIGS. 5A-C collectively illustrate the example DC bus bar 112 that can comprise a pair of bus bars, namely a positive bus bar 120 and a negative bus bar 122. Each of the bus bars can comprise an input tab and an output tab. For example, positive bus bar 120 may comprise a positive input tab 124 and a positive output tab 126, while negative bus bar 122 may comprise a negative input tab 128 and a negative output tab 130.

Both the positive bus bar 120 and the negative bus bar 122 can have a bar body that spans between their respective input tab and output tab. In one embodiment, the positive bus bar 120 can have a positive bar body 132 and the negative bus bar can comprise a negative bar body 134.

In some embodiments, the positive bus bar 120 and the negative bus bar 122 can be shaped similarly to one another. Both the positive bus bar 120 and negative bus bar 122 can have a first section and a second section. For example, the positive bus bar 120 can have a first section 136 and a second section 138. In some embodiments, the first section 136 and the second section 138 can be positioned relative to one another at a substantially right angle configuration. That is, the first section 136 may extend perpendicularly from the second section 138.

The negative bus bar 122 can comprise a first section 140 and a second section 142. In some embodiments, the first section 140 and second section 142 can be positioned relative to one another at a substantially right angle.

The input tabs on both the positive bus bar 120 and the negative bus bar 122 extend from their respective bar body. For example, the positive input tab 124 can extend in linear alignment with the first section 136 of the positive bar body 132. The positive output tab 126 can extend rearwardly from the second section 138 of the positive bus bar 120.

The positive bus bar 120 and the negative bus bar 122 can be placed into mating relationship with one another such that the positive bus bar 120 may be nested within the negative bus bar 122 with both being electrically isolated from one another. A space can exist between the positive bar body 132 and the negative bar body 134. The size of this space can be minimized, which can reduce inductance through the DC bus bar 112 and can minimize noise pick-up from stray fields within the inverter enclosure.

In one embodiment, the negative output tab 130 of the negative bus bar 122 may be offset to a side of the second section 142 of the negative bar body 134. Conversely, the positive output tab 126 of the positive bus bar 120 may be offset to a side of the second section 138 of the positive bar body 132. In one embodiment, the negative output tab 130 and the positive output tab 126 can be spaced apart from one another due to their positioning on their respective sides of their associated bar body. Similarly, the positive input tab 124 and the negative input tab 128 can be spaced apart from one another and can be individually secured to a terminal block, which is described in greater detail below.

In some embodiments, the space between the positive bar body 132 and the negative bar body 134 can be filled with an electrical insulator such as a Mylar™ film. Likewise, surfaces of the positive bar body 132 and the negative bar body 134 that face one another can be coated with a layer of an electrically insulating material rather than disposing an electrically insulating layer therebetween.

In some embodiments, the first section 136 of positive bar body 132 and the first section 140 of the negative bar body 134 can be surrounded, at least partially, with an input core 149. The input core 149 may be configured to contact a terminal block 146 onto which the pair of bus bars can be installed.

For example, the terminal block 146 can provide a mounting surface that supports the DC bus bar 112. The terminal block 146 can mount to the inner sidewall of the lower enclosure 108 and a lower support 148 of the lower enclosure 108.

In some embodiments, the input core 149 may be secured to the terminal block 146 using a compression plate 150. A spacer 152 can be disposed between the input core 149 and the compression plate 150. In one embodiment, the spacer 152 may be a silicon foam block, although other materials that would be known to one of ordinary skill in the art can also likewise be utilized in accordance with the present disclosure.

Figure 6:
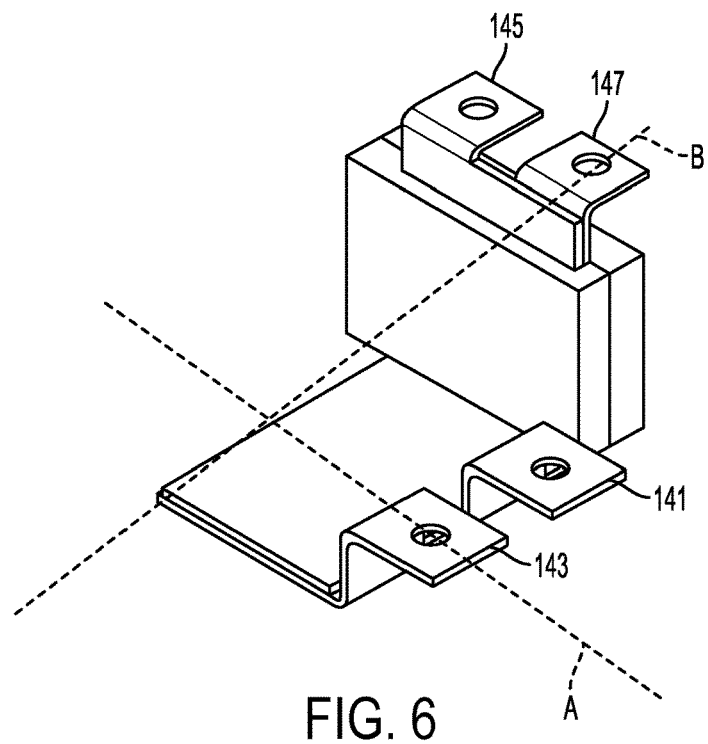
FIG. 6 is a perspective view of a portion of another exemplary DC bus bar sub-assembly.

Another example of a DC bus bar 112 is illustrated in FIG. 6. In this embodiment, the input tabs 141 and 143 can angle upwardly and outwardly from the bar bodies along reference line A, rather than in linear alignment. Also, the input tabs 141 and 143 can extend from a side edge of the bar bodies, while output tabs 145 and 147 can extend in alignment with reference line B. To be sure, reference line A and reference line B can be substantially perpendicular to one another.

Figure 7:
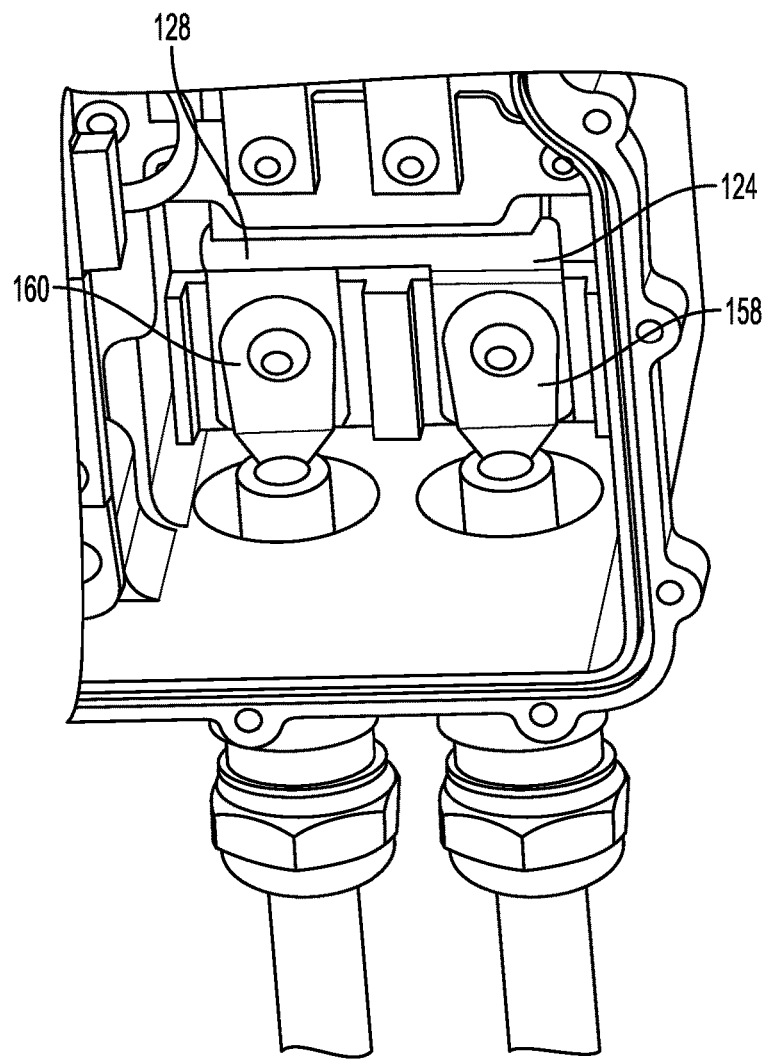
FIG. 7 is a perspective view of the exemplary DC bus bar sub-assembly connected to power cables.

Turning to FIG. 7, the positive input tab 124 and negative input tab 128 can be illustrated as being coupled with input power cables 158 and 160, respectively.

Figure 8:
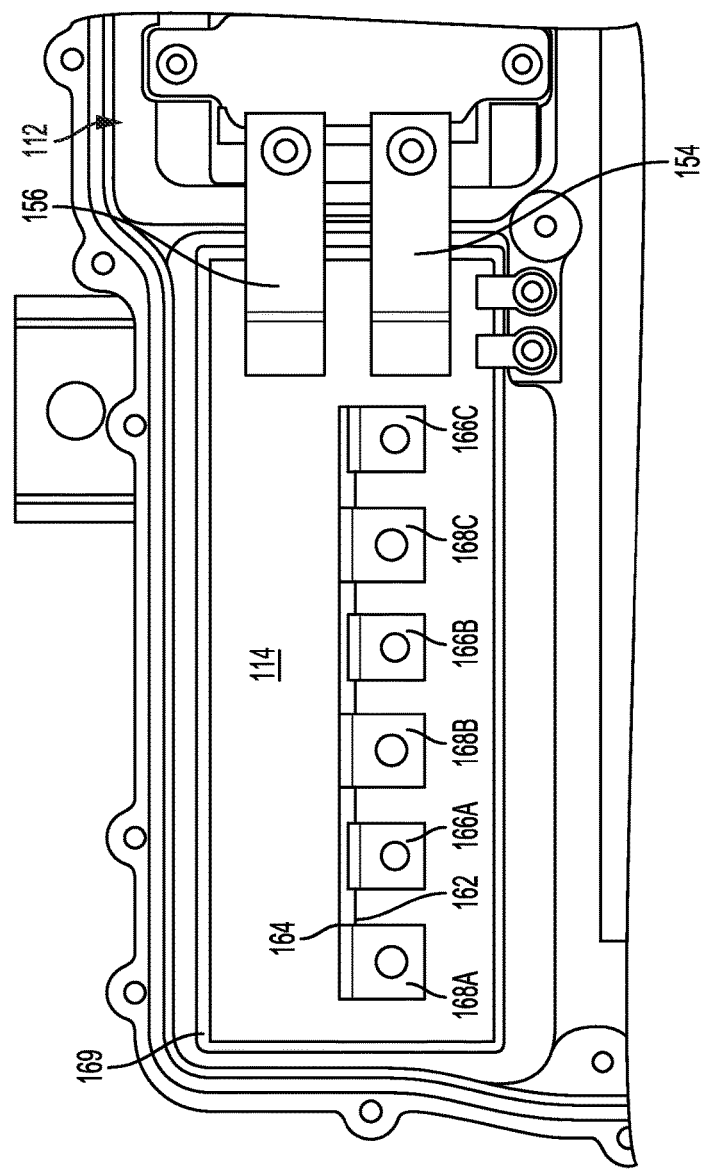
FIG. 8 is a top elevation view that illustrates an exemplary DC link capacitor of the inverter assembly, where the DC link capacitor may comprise a capacitor bank.

FIG. 8 is a top elevation view that illustrates the exemplary DC link capacitor 114 of the inverter assembly, where the DC link capacitor may comprise a capacitor bank. As illustrated in FIG. 8, in some embodiments, the DC bus bar 112 may be electrically coupled to the DC link capacitor 114 through a first connector 154 and a second connector 156. (The first connector and second connector 156 may variously be positive and negative connectors depending on the arrangement of the polarities provided by the DC bus bar 112.) According to some embodiments, the first connector 154 and second connector 156 can be coupled or embedded within the DC link capacitor 114. To be sure, the DC link capacitor 114 can be potted into place within the lower enclosure 108; the first connector 154 and second connector 156 being embedded into the DC link capacitor 114 during the potting process.

Additionally, a positive output bus bar 162 may be embedded into the DC link capacitor 114, along with a negative output bus bar 164. Both the positive output bus bar 162 and the negative output bus bar 164 comprise a plurality of output tabs. For example, the positive output bus bar 162 can comprise positive output tabs 166A-C, while negative output bus bar 164 can comprise negative output tabs 168A-C. In some embodiments, the positive output tabs 166A-C and the negative output tabs 168A-C can be positioned in linear alignment with one another. The positive output tabs 166A-C and the negative output tabs 168A-C can also be alternatingly positioned such that negative output tab 168A may be positioned between positive output tab 166A and positive output tab 166B, just as an example.

The DC link capacitor 114 can be potted into a void 169, in some instances. In one embodiment, the DC link capacitor 114 is secured within the void 169 with a potting material that can include a mixture of polyol and isocyanate. The potting material can include 100 parts polyol to 20 parts isocyanate, in some embodiments. The DC link capacitor material may be poured into the void 169 to a height of 45 to 50 mm below an upper edge of the void 169. The DC link capacitor material can be cured at 25 degrees centigrade for 24 hours, at 60 degrees centigrade for two hours, or also at 100 degrees centigrade for 20-30 minutes, in various embodiments.

Figure 9A:
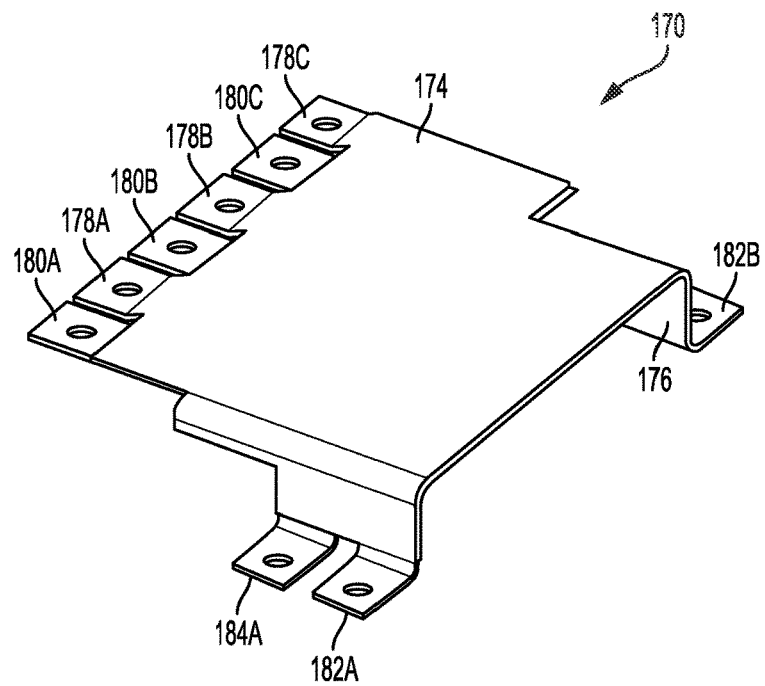
FIG. 9A is a perspective view of an exemplary DC input bus bar that couples the DC link capacitor with power modules.
Figure 9B:
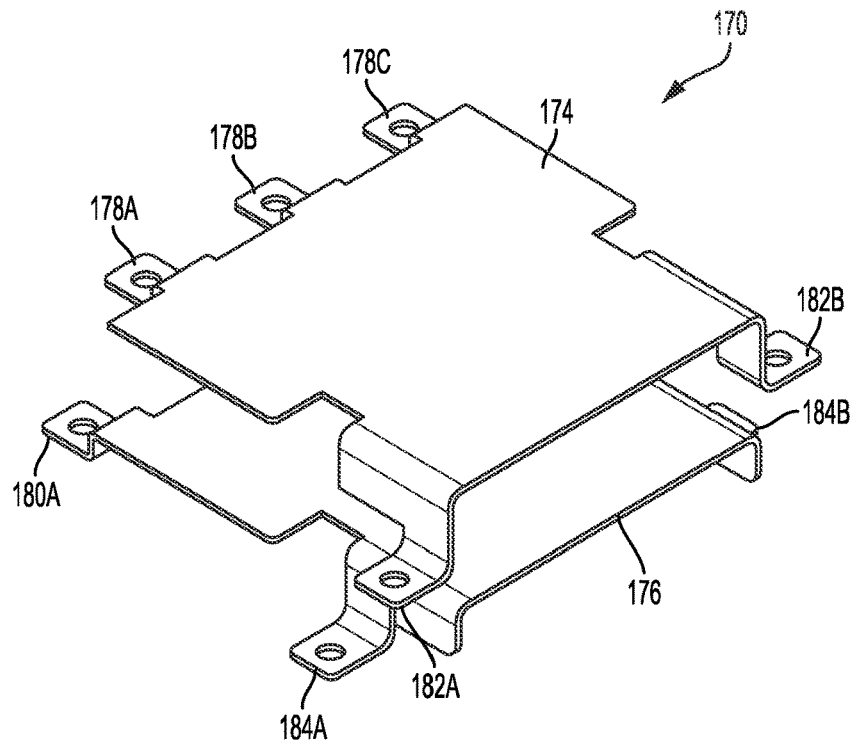
FIG. 9B is an exploded perspective view of another exemplary DC input bus bar of FIG. 9A.
Figure 9C:
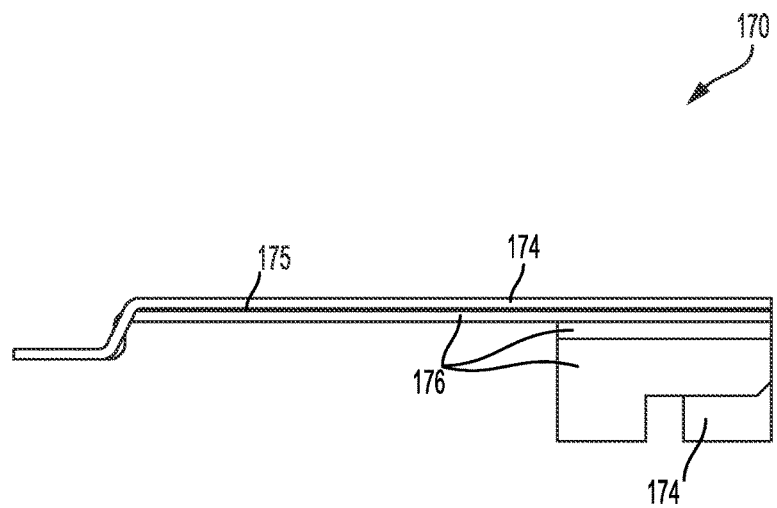
FIG. 9C is a cross sectional view of the exemplary DC input bus bar of FIGS. 9A and 9B.
Figure 10:
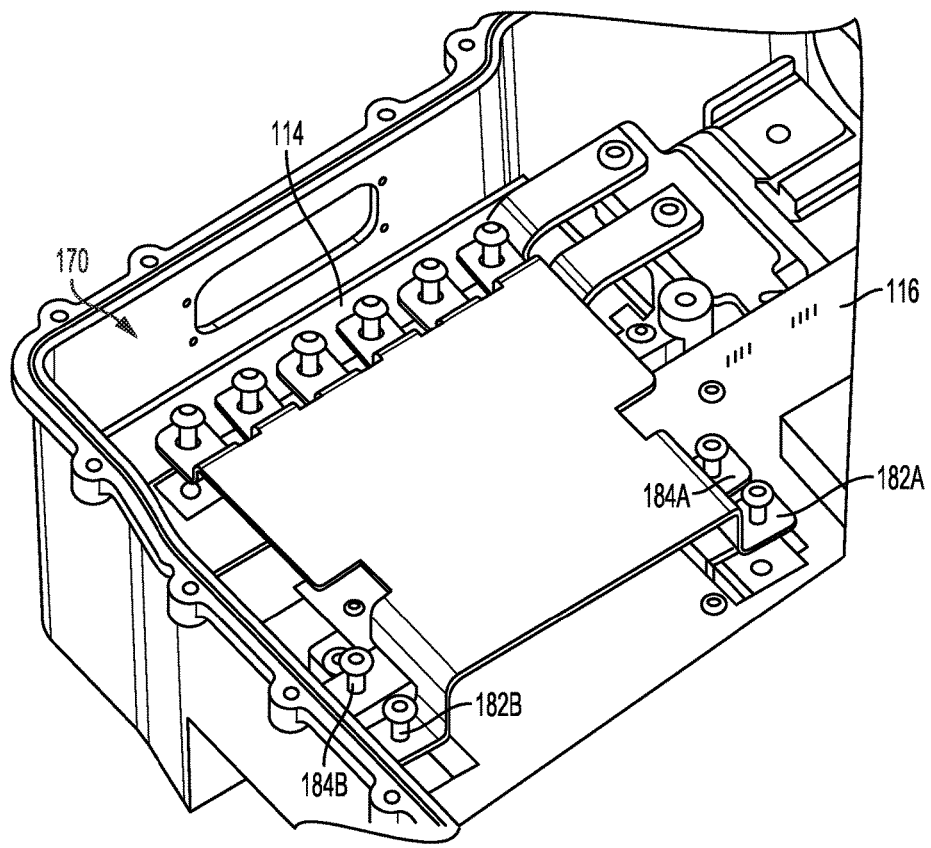
FIG. 10 is a perspective view of the exemplary DC input bus bar installed into the inverter assembly.

Referring now to FIGS. 9A-10, which illustrate an example DC input bus bar sub-assembly 170. The DC input bus bar sub-assembly 170 can also be referred to as a "second DC bus bar sub-assembly" or "DC input bus bar 170". The DC input bus bar 170 can comprise a positive bus bar 174 and a negative bus bar 176, which can be arranged into a mating relationship with one another similarly to the DC bus bar 112 described above.

The positive bus bar 174 can comprise a plurality of positive input tabs 178A-C and the negative bus bar 176 can comprise a plurality of negative input tabs 180A-C. When installed, the positive bus bar 174 can couple with the positive output bus bar 162 of the DC link capacitor 114 by connecting the plurality of positive input tabs 178A-C of the positive bus bar 174 with the positive output tabs 166A-C of the positive output bus bar 162 of the DC link capacitor 114. Likewise, the negative bus bar 176 can couple with the negative output bus bar 164 of the DC link capacitor 114 by connecting the plurality of negative input tabs 180A-C of the negative bus bar 176 with the negative output tabs 168A-C of the negative output bus bar 164 of the DC link capacitor 114.

The plurality of positive input tabs 178A-C and the plurality of negative input tabs 180A-C can be arranged in an alternating and linear configuration.

The positive bus bar 174 and negative bus bar 176 can be placed in an overlaid mating relationship with one another. A space 175 may be provided between the positive bus bar 174 and negative bus bar 176, which can be filled with an electrically insulating material, in some embodiments. The space 175 between the positive bus bar 174 and negative bus bar 176 can allow for low inductance of current through the DC input bus bar sub-assembly 170.

The positive bus bar 174 can comprise a pair of positive output tabs 182A and 182B, while the negative bus bar 176 can comprise a pair of negative output tabs 184A (shown in FIG. 10) and 184B. The pair of positive output tabs 182A and 182B can be disposed on opposing sides of the positive bus bar 174 relative to one another. The pair of negative output tabs 184A and 184B can also be disposed on opposing sides of the negative bus bar 176 relative to one another. The pairs of negative and positive output tabs can be arranged such that positive output tab 182A may be placed in proximity to negative output tab 184A, while positive output tab 182B may be placed in proximity to negative output tab 184B.

As illustrated best in FIG. 10, the DC input bus bar 170 can provide electrical connectivity between the DC link capacitor 114 and the power modules of the gate drive circuit board 116, which will be described in greater detail below. In one embodiment, the positive output tab 182A and negative output tab 184A can be coupled, through an opening in the gate drive circuit board 116, to a first power module 188. The positive output tab 182B and negative output tab 184B can be coupled to a second power module 186.

Figure 11:
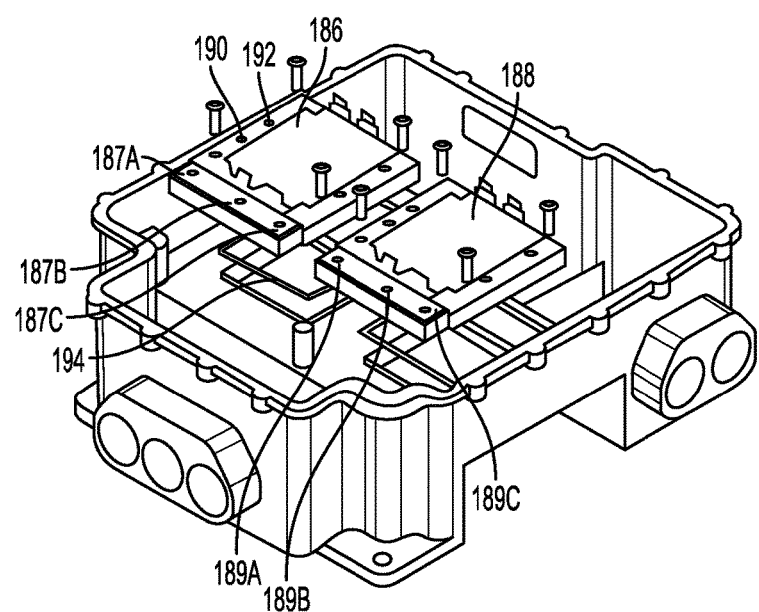
FIG. 11 is a partial exploded perspective view of exemplary power modules.

FIG. 11 is a partial exploded perspective view illustrating exemplary first and second power modules 186 and 188, with the gate drive circuit board removed, as well as the various bus bars and the DC link capacitor described above. Each of the first and second power modules 186 and 188 can comprise a pair of positive and negative input terminals. For example, first power module 186 can include positive terminal 190 and negative terminal 192. Each of the power modules can be coupled to a bottom of the lower enclosure 108 with a gasket, such as gasket 194. In various embodiments, the gaskets can serve to create a fluid impermeable seal that keeps fluid from a cooling sub-assembly from entering the lower enclosure 108. As will be discussed in greater detail herein, heat sinks of the power modules 186 and 188 can be exposed to a coolant fluid by the cooling sub-assembly. The coolant fluid can remove excess heat from the power modules increasing their performance.

Each of the exemplary power modules 186 and 188 can comprise three output terminals that each can output a different phase of an AC power signal that can be generated by the power module. For example, first power module 186 can comprise output terminals 187A, 187B, and 187C and second power module 188 can comprise output terminals 189A, 189B, and 189C.

Figure 12:
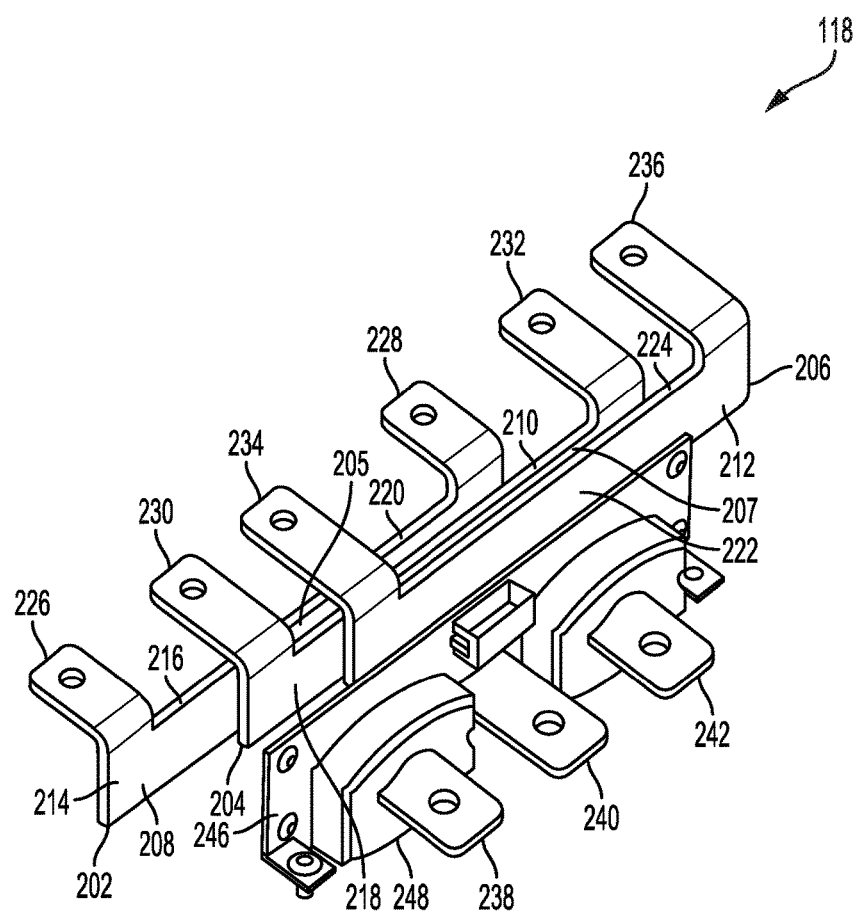
FIG. 12 is a perspective view of an exemplary three phase output AC bus bar sub-assembly.
Figure 13:
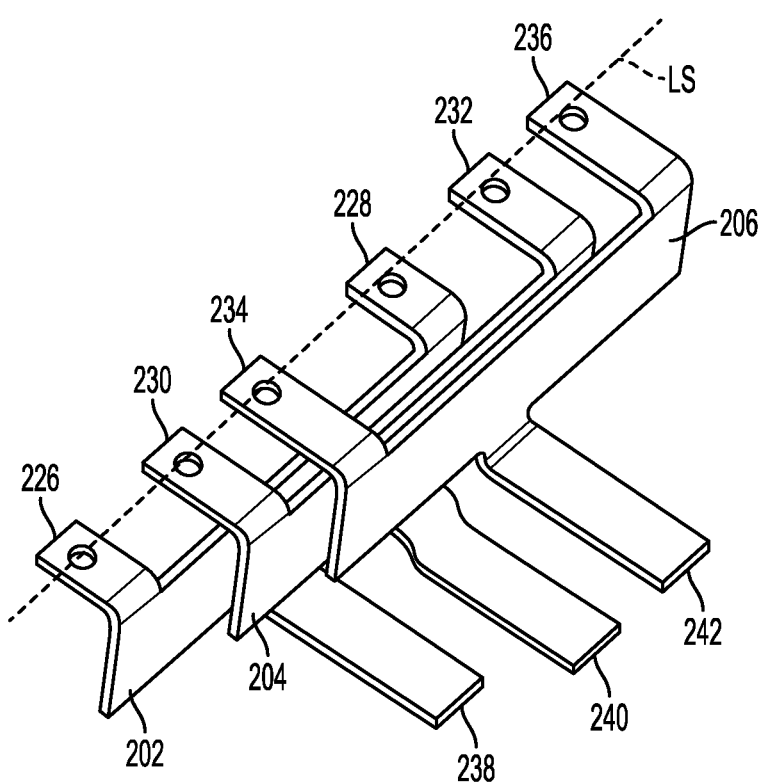
FIG. 13 is another perspective view of the exemplary three phase output AC bus bar sub-assembly.

FIGS. 12 and 13 collectively illustrate an example three phase output AC bus bar sub-assembly (hereinafter "AC bus bar 118"). In some embodiments, the AC bus bar 118 can comprise three bus bars such as a first bus bar 202, a second bus bar 204, and a third bus bar 206.

Each of the first, second and third bus bars 202, 204, 206 can comprise a bar body. For example, first bus bar 202 can comprise a bar body 208, the second bus bar 204 can comprise a bar body 210, and the third bus bar 206 can comprise a bar body 212. Each of the first, second and third bus bars 202, 204, 206 can comprise a front and back surface. For example, the bar body 208 of the first bus bar 202 can comprise a front surface 214 and a back surface 216. The bar body 210 of the second bus bar 204 can comprise a front surface 218 and a back surface 220, while the bar body 212 of the third bus bar 206 can comprise a front surface 222 and a back surface 224.

In one embodiment, the first, second and third bus bars 202, 204, 206 can be spaced apart from one another while being positioned in a nested configuration. Thus, a space 205 can exist between the front surface 214 of the first bus bar 202 and the back surface 216 of the second bus bar 204. Likewise, the third and second bus bars can be spaced apart from one another to form a space 207 between the front surface 214 of the second bus bar 204 and the back surface 220 of the third bus bar 206. The spaces 205 and 207 can each be filled with an electrically insulating material. In other embodiments, the front and/or back surfaces of the bus bars 202, 204, 206 can be coated with an insulating layer of material that can be adapted to provide electrical insulation.

Each of the first, second and third bus bars 202, 204, 206 also can comprise a plurality of power module tabs that can electrically couple each of the bus bars with both the first and second power modules 186 and 188 (see FIG. 11). For example, the first bus bar 202 can comprise power module tabs 226 and 228, while the second bus bar 204 can comprise power module tabs 230 and 232. The third bus bar 206 can comprise power module tabs 234 and 236. The power module tabs of any one of the bus bars can be spaced apart from one another so as to allow for the bus bar to connect with each of the power modules.

The plurality of power module tabs of each of the bus bars can extend away from the back surface of their respective bar body. The plurality of power module tabs 226, 228, 230, 232, 234, and 236, can be coplanar and aligned with one another along a longitudinal axis of alignment Ls (see FIG. 13).

In some embodiments, the first, second and third bus bars 202, 204, 206 can be placed into a nested but offset relationship with one another. For example, second bus bar 204 can be disposed in front of first bus bar 202, while third bus bar 206 can be disposed in front of second bus bar 204. Also, the bus bars can be staggered or offset from one another. The second bus bar 204 can be offset from the first bus bar 202, and the third bus bar 206 can be offset from the second bus bar 204. In this configuration, the power module tab 230 of the second bus bar 204 can be positioned between the power module tab 226 of the first bus bar 202 and the power module tab 234 of the third bus bar 206. Power module tab 234 of the third bus bar can be positioned between the power module tab 230 of the second bus bar 204 and the power module tab 228 of the first bus bar 202. Power module tab 228 of the first bus bar 202 may be positioned between the power module tab 234 of the third bus bar 206 and the power module tab 232 of the second bus bar 204. Power module tab 232 may be positioned between the power module tab 228 of the first bus bar 202 and the power module tab 236 of the third bus bar 206.

In some embodiments, a length of the power module tabs (234, 236) of the third 206 of the three bus bars may be greater than a length of the power module tabs (230, 232) of the second 204 of the three bus bars. Also, the length of the power module tabs (230, 232) of the second 204 of the three bus bars can be greater than a length of the power module tabs (226, 228) of the first 202 of the three bus bars.

Each of the first, second and third bus bars 202, 204, 206 also can comprise an output tab, which can extend from a front surface of their respective bar body. For example, the first bus bar 202 can comprise an output tab 238, the second bus bar 204 can comprise an output tab 240, and the third bus bar 206 can comprise an output tab 242.

In one embodiment, the output tabs 238, 240, and 242 can be arranged so as to be symmetrical in their positioning relative to one another. Due to spacing of the output terminals of each of the power modules (described above), and in order to maintain symmetry of the output tabs 238, 240, and 242, output tab 240 can have a substantially serpentine shaped section 244 that can position the output tab 240 in between output tabs 238 and 242.

In some embodiments, the bus bars 202, 204, 206 can be held in their respective positions using a mounting plate 246 (see FIG. 12). The mounting plate 246 may be adapted with apertures. The output tabs 238, 240, and 242 can each extend through these apertures. In one embodiment, the output tabs 238, 240, and 242 can be secured in place on the mounting plate 246 with locking members, such as locking member 248.

The mounting plate 246 can be coupled to the second and the third of the three bus bars (see example shown in FIG. 12).

Figure 14:
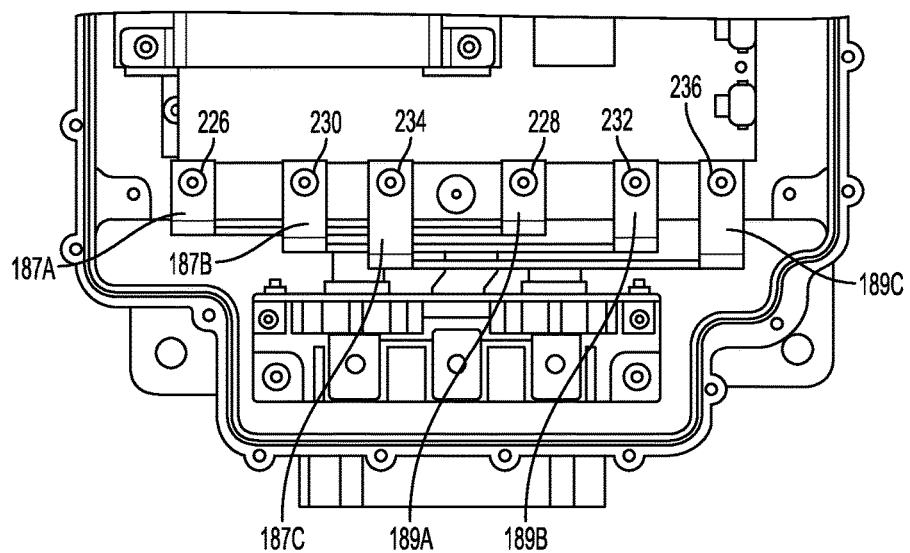
FIG. 14 is a perspective view of the exemplary three bus bars of the three phase output AC bus bar sub-assembly.
Figure 15:
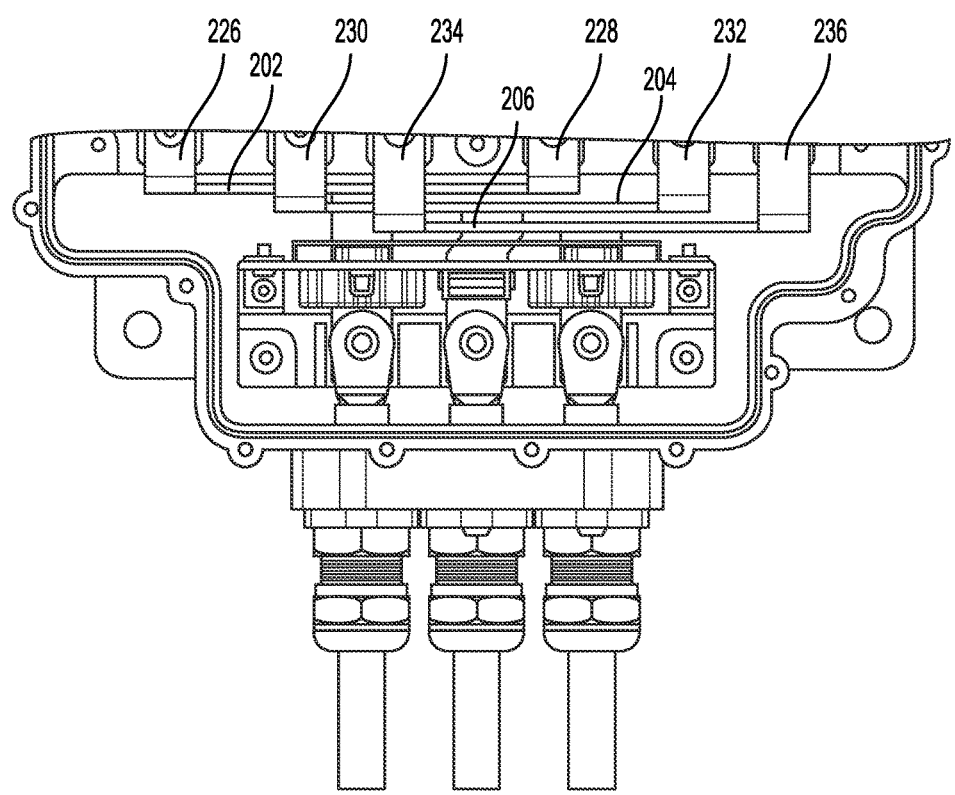
FIG. 15 is a top down view of the exemplary three phase output AC bus bar sub-assembly installed into the inverter assembly.

Referring now to FIGS. 14 and 15 (and FIGS. 11, 12, and 13), according to some embodiments, power module tabs 226 and 228 of the first bus bar 202 (see FIG. 12) can connect with output terminal 187A (see also FIG. 11) of first power module 186 and output terminal 189A of second power module 188. The second bus bar 204 may connect with output terminal 187B of first power module 186 and output terminal 189B of second power module 188. The third bus bar 206 can couple with output terminal 187C of first power module 186 and output terminal 189C of second power module 188.

Figure 16:
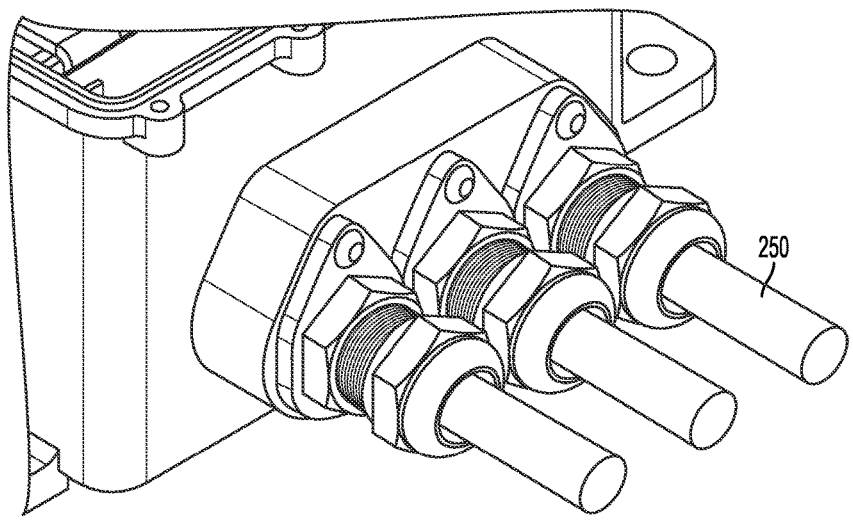
FIG. 16 is a perspective view of the exemplary three phase output AC bus bar sub-assembly coupled with power cables.

In FIG. 16, a plurality of power cables, such as power cable 250 can be coupled with the output tabs 238, 240, and 242 (see FIGS. 14-15) of the AC bus bar 118.

Figure 17:
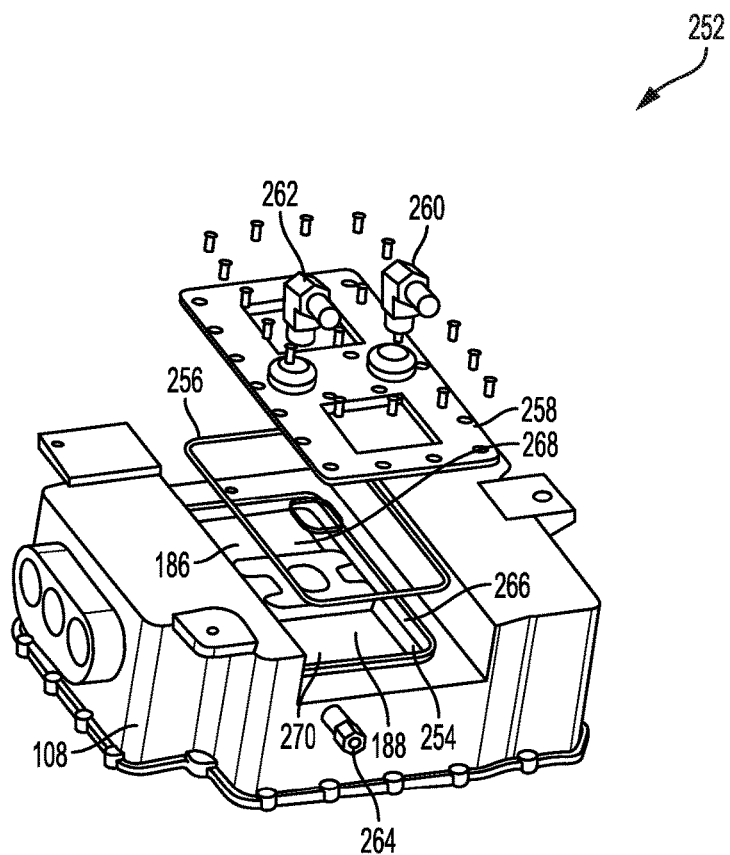
FIG. 17 is an exploded view of an exemplary cooling assembly.

FIG. 17 illustrates an example cooling sub-assembly 252 that can comprise a cooling cavity 254, a gasket 256, cover plate 258, an inlet port 260, an outlet port 262, and a purge port 264. In general, the cooling cavity 254 may be formed by a sidewall 266 formed into a lower enclosure 108 of the housing. Heat sinks 268 and 270 of the power modules 186 and 188, respectively, can be exposed to the cooling cavity 254. As mentioned above, the power modules 186 and 188 can be isolated with gaskets so as to prevent fluid inside the cooling cavity 254 from entering the housing.

When the cover plate 258 may be joined to the lower enclosure 108 of the housing, a fluid, such as a coolant can be pumped into the cooling cavity 254 through the inlet port 260 and can be extracted through the outlet port 262 using a pump (not shown). The purge port 264 can be used to purge trapped air from the cooling cavity 254 if needed.

In one embodiment, the inlet and outlet ports 260 and 262 can be disposed near a center of the housing which can help promote equal flow rate of fluid to each cooling cavity.

Figure 18A:
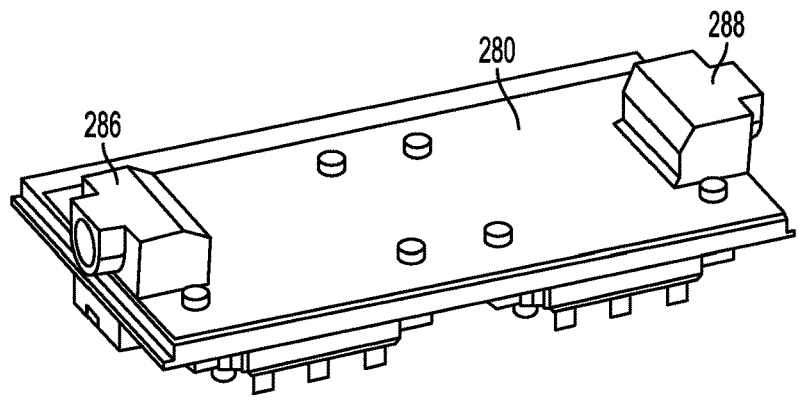
FIGS. 18A-C illustrate an exemplary alternative cooling assembly.
Figure 18B:
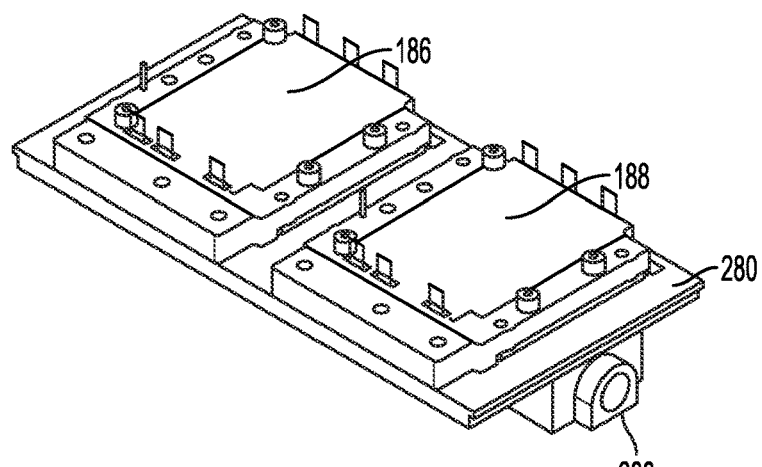
Figure 18C:
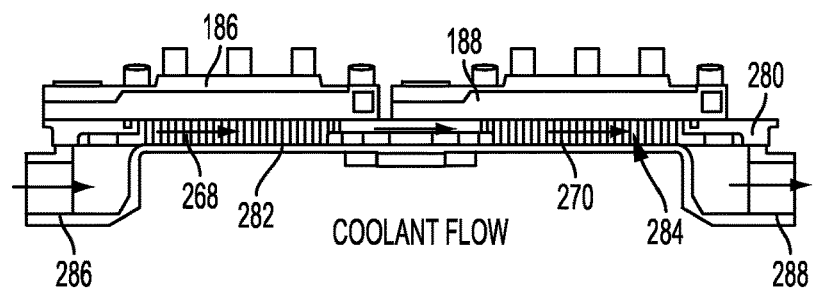

FIGS. 18A-C collectively illustrate another embodiment of a cooling sub-assembly. In one embodiment, the first and second power modules 186 and 188 can be mounted to a plate 280. A sidewall (See e.g., 266 in FIG. 17) defines a cooling cavity (See e.g., 254 in FIG. 17). The heat sinks 268 and 270 can be positioned within the cooling cavity 254. An inlet port 286 may be positioned on one end of the cooling cavity 254 and the outlet port 288 may be positioned on the opposing end of the cooling cavity 254. As fluid may be introduced into the inlet port 286 and removed from the outlet port 288, the fluid can remove heat from the first and second power modules 186 and 188 as it communicates over the heat sinks 268 and 270, for providing a substantially equal share of coolant to each power module. In some other embodiments (see e.g., FIG. 17) the inlet port may be positioned substantially midway between heat sinks 268 and 270 such that coolant may be communicated from the substantially midway point so coolant can flow bidirectionally, over the heat sink 268 in one direction and heat sink 270 in the other direction, and be collected substantially in the middle, for providing substantially equal share of coolant to each power module, with less thermal differential across the power modules.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. An inverter assembly, comprising:
a housing that encloses:
  a DC input bus bar sub-assembly;
  a DC link capacitor electrically coupled to the DC input bus bar sub-assembly;
  a second DC bus bar sub-assembly that electrically couples the DC link capacitor with at least first and second power modules each comprising three output terminals;
  a single three phase output AC bus bar sub-assembly comprising at least a first set of three power module tabs electrically coupled to respective ones of the three output terminals of the first power module and a second set of three power module tabs electrically coupled to respective ones of the three output terminals of the second power module; and
a cooling sub-assembly that is associated with the plurality of power modules;
wherein the three phase output AC bus bar sub-assembly comprises:
three bus bars, each comprising:
  a bar body having a front surface and a back surface;
  at least two power module tabs spaced apart from one another, a first tab of the at least two power module tabs being coupled with the first power module of the inverter assembly and a second tab of the at least two power module tabs being coupled with the second power module of the inverter assembly, the power module tabs extending away from the back surface, and wherein each of the at least two power module tabs is in direct contact with the bar body;
  an output tab extending from the front surface; and
  the bar body of a first of the three bus bars is positioned behind the bar body of a second of the three bus bars and a third of the three bus bars is positioned in front of the second of the three bus bars.

2. An inverter assembly, comprising:
a housing that encloses:
  a DC input bus bar sub-assembly;
  a DC link capacitor electrically coupled to the DC input bus bar sub-assembly;
  a second DC bus bar sub-assembly that electrically couples the DC link capacitor with at least first and second power modules each comprising three output terminals;
  a single three phase output AC bus bar sub-assembly comprising at least a first set of three power module tabs electrically coupled to respective ones of the three output terminals of the first power module and a second set of three power module tabs electrically coupled to respective ones of the three output terminals of the second power module; and
a cooling sub-assembly that is associated with the plurality of power modules; wherein the second DC bus bar sub-assembly comprises:
  a pair of bus bars that each comprise:
    a bar body;
    a plurality of input tabs extending from a first end of the bar body, the plurality of input tabs are coupled to the DC link capacitor; and
    a plurality of output tabs, wherein the plurality of output tabs are disposed on opposing sides of the bar body relative to one another;
    the bar bodies of the pair of bus bars are overlaid upon one another but spaced apart from one another; and the plurality of input tabs of a first of the pair of bus bars are disposed into alternating relationship with the plurality of input tabs of a second of the pair of bus bars in alignment with one another.

3. The inverter assembly according to claim 2, wherein the three phase output AC bus bar sub-assembly comprises three substantially symmetrical output tabs that each carry a unique phase of an AC power signal generated by the plurality of power modules.

4. The inverter assembly according to claim 2, wherein the plurality of output tabs of the first of the pair of bus bars are adjacent to the plurality of output tabs of the second of the pair of bus bars.

5. The inverter assembly according to claim 4, wherein an output tab of the first of the pair of bus bars and an output tab of the second of the pair of bus bars, which are adjacent to one another, are electrically coupled to one of the plurality of power modules.

6. The inverter assembly according to claim 2, further comprising a gate drive circuit board, wherein the plurality of power modules are electrically coupled to the gate drive circuit board.

7. The inverter assembly according to claim 6, wherein the gate drive circuit board is notched to accommodate a plurality of output tabs of the second DC bus bar subassembly.

8. The inverter assembly according to claim 2, wherein heat sinks of the plurality of power modules are disposed within a cavity formed by a sidewall of the cooling subassembly.

9. The inverter assembly according to claim 8, wherein the cooling subassembly comprises an input port and an output port that are disposed centrally to the housing and in between the heat sinks of the plurality of power modules.

10. The inverter assembly according to claim 8, wherein the cooling subassembly comprises an input port disposed on a first end of an underside of the housing and an output port disposed on a second end of the underside of the housing.

11. The inverter assembly according to claim 2, further comprising a terminal block that supportingly couples the DC input bus bar sub-assembly with a lower enclosure of the housing.

12. The inverter according to claim 2, further comprising a positive output bus bar and a negative output bus bar that are embedded into the DC link capacitor, wherein the positive output bus bar and the negative output bus bar are electrically coupled to a plurality of input tabs of the second DC bus bar sub-assembly.

13. The inverter according to claim 2, wherein the DC input bus bar subassembly is electrically coupled with a first connector and a second connector that are each at least partially embedded into the DC link capacitor.

14. The inverter according to claim 13, wherein the DC input bus bar sub-assembly comprises a pair of bus bars that each comprise:
an input tab;
an output tab; and
a bar body, the input tab extending in alignment with a first section of the bar body, the output tab extending normally to a second section of the bar body.

15. An inverter assembly, comprising:
a housing that encloses:
a DC input bus bar sub-assembly;
a DC link capacitor electrically coupled to the DC input bus bar sub-assembly;
a gate drive circuit board;
at least first and second power modules mounted to the gate drive circuit board, the power modules producing an AC power signal, each power module comprising three output terminals; and
a second DC bus bar sub-assembly that electrically couples the DC link capacitor with the plurality of power modules,
a single three phase output AC bus bar sub-assembly comprising at least a first set of three power module tabs electrically coupled to respective ones of the three output terminals of the first power module and a second set of three power module tabs electrically coupled to respective ones of the three output terminals of the second power module;
wherein the gate drive circuit board comprises notching that allows input tabs of the plurality of power modules to directly couple with a plurality of positive and negative output tabs of the second DC bus bar sub-assembly.

16. The inverter assembly according to claim 15, wherein the gate drive circuit board comprises additional notching that allows power module tabs of the three phase output AC bus bar sub-assembly to directly couple with the output tabs of the plurality of power modules.

17. An inverter assembly, comprising:
a housing that encloses:
a DC input bus bar sub-assembly;
a DC link capacitor electrically coupled to the DC input bus bar sub-assembly;
a second DC bus bar sub-assembly that electrically couples the DC link capacitor with at least first and second power modules each comprising three output terminals;
a single three phase output AC bus bar sub-assembly comprising at least a first set of three power module tabs electrically coupled to respective ones of the three output terminals of the first power module and a second set of three power module tabs electrically coupled to respective ones of the three output terminals of the second power module; and
a cooling sub-assembly that is associated with the plurality of power modules;
wherein the three phase output AC bus bar sub-assembly comprises:
a first bus bar comprising a first power module tab of the first set, a first power module tab of the second set, and a first output of the three phase output AC bus bar subassembly;
a second bus bar comprising a second power module tab of the first set, a second power module tab of the second set, and a second output of the three phase output AC bus bar sub-assembly; and
a third bus bar comprising a third power module tab of the first set, a third power module tab of the second set, and a third output of the single three phase output AC bus bar sub-assembly.

* * * * *